Feb. 6, 1968 L. D. LOCH 3,367,803
THERMOELECTRIC DEVICE COMPRISING $100SnO_2 \cdot xSb_2O_3$
Filed July 9, 1963
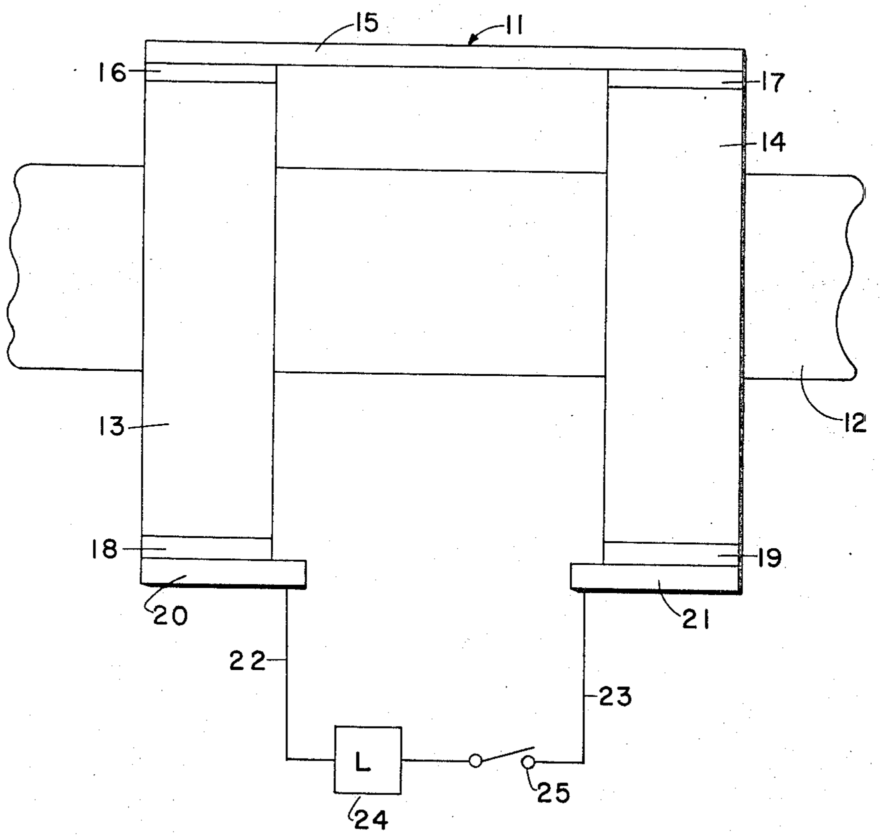
INVENTOR.
LUTHER D. LOCH
BY
H. W. Brownell
ATTORNEY United States Patent Office 3,367,803
Patented Feb. 6, 1968

3,367,803
THERMOELECTRIC DEVICE COMPRISING
$100SnO_2 \cdot xSb_2O_3$

Luther D. Loch, Youngstown, N.Y., assignor to The Carborundum Company, Niagara Falls, N.Y., a corporation of Delaware Filed July 9, 1963, Ser. No. 293,717
5 Claims. (Cl. 136—238)

The invention of the present application relates to thermoelectric elements which are efficient at relatively high temperatures for the generation of electrical power and, more particularly is concerned with semiconductor materials useful for such elements.

The use of thermoelectric devices to generate electrical power has recently become a matter of great interest and importance. Not only is there interest in their use with conventional fuels where the absence of moving parts is desirable but their possibilities in the utilization of nuclear and focused solar heat sources and in the salvage of waste heat are also attractive.

The Seebeck effect, which causes an electrical current flow when the junctions of dissimilar materials forming a thermocouple loop are subjected to different temperatures, has long been known and has been utilized, as in thermocouples, for measuring temperatures. More recently devices utilizing two unlike semi-conductor materials in a thermocouple loop have been found to have low but, for some purposes, useful efficiencies in the generation of electrical power from heat applied to one junction of the materials. However, such devices have shown marked decreases in efficiency as the temperature of the heated junction was raised and no material capable of providing a reasonably efficient thermoelectric device for operation at temperatures in excess of about 1000° K. has previously been known.

In evaluating thermoelectric elements the most common method is to compare their respective figures of merit. The figure of merit (Z) is calculated from the formula $$Z=S^2/pK$$

in which S is the Seebeck coefficient expressed in volts/° C.; $p$ is the electrical resistivity expressed in ohm-cm.; and K is the thermal conductivity expressed in watts/cm./° C. The more efficient the thermoelectric element the higher the figure of merit.

In cases where the efficiency of a thermoelectric element is materially affected by differences in temperature its relative merit may be more conveniently determined by calculations from the formula $$M=TS^2/4pK$$

in which S, $p$, and K have the same meanings as in the previously stated formula and T is temperature expressed in ° K. Here M designates the index of efficiency.

It is an object of the present invention to provide an n-type semiconductor that may be used as a thermoelectric element at high temperatures and which has a high figure of merit and a high index of efficiency.

Another object of the present invention is to provide thermoelectric devices which are useful at temperatures above about 1000° K.

A further object of the invention is to provide thermoelectric devices of the character described which utilize an n-type semiconductor.

Other objects and advantages of the present invention will be apparent from the following description thereof.

It has been found that the foregoing objects may be achieved with self-supporting sintered n-type semiconductor bodies having a composition corresponding to the molal formula $100(SnO_2) \cdot x(Sb_2O_3) \cdot y(MO)$, wherein M represents at least one metal from the group consisting of zinc and cadmium, $x$ has a value varying from 0.05 to 0.5, and $y$ has a value varying from 0 to 5. The sintering is preferably carried out at temperatures of at least about 1400° C. and under oxidizing conditions.

The following Examples, 1–6, inclusive, set forth the procedure for producing n-type semiconductor bodies according to the invention, using stannic oxide, antimony trioxide and either zinc oxide or cadmium oxide.

*Example I*

An intimate mixture of 100 moles $SnO_2$, 0.05 mole $Sb_2O_3$, and 3 moles ZnO is formed, the materials being dry mixed in the form of minus 100 mesh powders and then triturated with a liquid, such as water, while heat is gently applied. The powder mixture when almost dry, was placed in suitable molds and pressed at approximately 5000 p.s.i. to form small bars. These bars, 2 inches x ¼ inch x ¼ inch were fired, in an oxidizing atmosphere, at 1400° C. for 2 hours. It was found that the bars had an index of efficiency (M) of 0.040 at 1000° K. and were dense, fine-grained ceramic bodies, light grey in color.

*Example II*

Using the same procedure as set forth in Example I but employing a mixture of 100 moles $SnO_2$, 0.1 mole $Sb_2O_3$, and 3 moles ZnO, additional bars were molded and fired. The resulting bars were quite dense and fine-grained and had an index of efficiency (M) of 0.050 at 1000° K.

*Example III*

Using the same procedure as set forth in Example I but employing a mixture of 100 moles $SnO_2$, 0.1 mole $Sb_2O_3$, and 1 mole ZnO, additional bars were molded and fired. The resulting light grey, fine-grained bars had an index of efficiency (M) of 0.054 at 1000° K.

*Example IV*

The same procedure as employed in Example I was used in blending together, pressing into bars, and firing a mixture of 100 moles $SnO_2$, 0.5 mole $Sb_2O_3$, and 3 moles ZnO. The bars obtained were fine-grained and dark grey in color. They had, when tested at 1000° K., an index of efficiency (M) of 0.033.

*Example V*

The same procedure as employed in Example I was used in blending together, pressing into bars, and firing a mixture of 100 moles $SnO_2$, 0.1 mole $Sb_2O_3$, and 3 moles CdO. The bars obtained had an index of efficiency (M) of 0.031 at 1000° K. and were light grey, fine-grained bodies.

*Example VI*

Using a mixture of 100 moles $SnO_2$, 0.1 mole $Sb_2O_3$, and 5 moles CdO and employing the same procedure as that of Example I, fired ceramic bars having an index of efficiency (M) of 0.028 at 1000° K. were made. These bars were dense, grey, fine-grained bodies.

In the following example although neither ZnO nor CdO is used, the index of efficiency at 1000° K. is in the same range as in the last three examples.

*Example VII*

An intimate mixture of 100 moles $SnO_2$ and 0.1 mole $Sb_2O_3$ was made, the materials being minus 100 mesh powders and the final mixing being wet. While the mixture was still slightly damp it was pressed into small bars at approximately 5000 p.s.i. The bars were fired at 1400° C. for two hours in an oxidizing atmosphere and when cool were found to be dense, well sintered, and grey in color. The index of efficiency at 1000° K. of the ceramic bars was 0.027.

n-Type semiconductors according to the present invention are characterized by high electrical conductivity, i.e. low resistivity, and low thermal conductivity, those products in which ZnO or CdO is added to the $SnO$-$Sb_2O_3$ mixture, which constitutes the major portion of the bodies, having unexpectedly high electrical conductivities. Since the Seebeck coefficient is not substantially changed by such additions the thermoelectric figure of merit is greatly increased. Further, as shown below, the index of efficiency of many such products increases rapidly and markedly with increasing temperatures.

It has been found that the figures of merit, as thermoelectric elements, of the semiconductor compositions according to the present invention are higher at temperatures of 1000° K. and above than those of other known elements proposed for practical use in high temperature thermoelectric devices. Also, as indicated above, the figures of merit in many cases increase rapidly with increasing temperature. The following table presents a comparison of the thermoelectric properties of the novel products of the present invention with those of an n-type, oxidic product described in the literature and suggested as being of commercial usefulness for power generation by thermoelectric means at higher temperatures.

TABLE A

| Composition | Index of Efficiency (M) | | |
|---|---|---|---|
| | 1,000° K. | 1,200° K. | 1,500° K. |
| A | 0.052 | 0.091 | 0.18 |
| B | 0.023 | 0.030 | 0.040 |

In Table A, Composition A is that produced by the procedure of Example III, above, while Composition B is the n-type, $TiO_2$-doped $Fe_2O_3$ referred to by R. D. Fenity in an article in Electronics, vol. 35, No. 5 (1962), pp. 39–41.

While in the foregoing examples the n-type semi-conductor bodies were formed by cold pressing before sintering, it will be understood that they may be formed, if desired, by extrusion of the blended oxides admixed with a small amount, i.e. of the order of 1–3%, of a fugitive organic binder such as wax, methyl cellulose, polyvinyl alcohol, or the like. Such extrusion can be carried out in known manner with conventional apparatus. It should be noted that an organic binder may also be used, if desired in forming pressed bodies according to the invention. Any desired sintering procedure can be used. However, as pointed out above oxidizing conditions should be employed in the kiln and a temperature of at least 1400° C. should be employed. In some cases a sintering temperature of about 1500° C. may be preferred and temperatures up to even about 1600° C. may be used.

The novel n-type semiconductor compositions of the present invention may be adapted for use in generating electrical current in any suitable, known manner. Thus, an element formed of such composition may be paired with a p-type element to produce a couple; or a plurality of elements formed from such n-type compositions may be electrically joined in series. In each case the elements are so arranged that portions thereof may be heated and, if desired, other portions may be cooled, to cause the production of the electrical current. Desired voltage output can be obtained in known manner by disposing thermoelectric generating devices in series.

An arrangement of the type first mentioned in the preceding paragraph is illustrated somewhat schematically in the accompanying drawing. Here the thermoelectric device generally designated by the numeral 11 is installed in a wall 12 of a furnace or other suitable heating device. The wall 12 is preferably characterized by high thermal insulating value as the overall efficiency of the device is thereby increased. The wall 12 is provided with a pair of adjacent orifices or holes therethrough in which are mounted, respectively, a bar 13 which is an n-type thermoelectric element according to the present invention and a bar 14 which is a p-type thermoelectric element.

On the furnace side of the wall 12 a conducting strip 15 joins the elements 13 and 14. The strip 15 is preferably of metal. It may be conveniently attached to the elements 13 and 14 by brazing or welding it to metal coatings 16 and 17, respectively, that have been provided on the ends of the elements by vacuum sputtering or in other suitable manner. A practical minimum of resistance in the strip 15 is preferred.

On the outer side of the wall 12 the elements 13 and 14 are provided, respectively, with metal coatings 18 and 19 which may be applied in the same way as coatings 16 and 17. To the coatings 18 and 19 are respectively attached, as by welding or brazing, metal plates 20 and 21. The plates 20 and 21 preferably have an extended surface area which may be obtained in any convenient manner, for example by providing fins, and are adapted to dissipate heat, with or without artificial cooling by means of an air or liquid current directed thereon. The plates 20 and 21 also serve for electrical connections to the thermoelectric generator. As depicted in the drawing, conductors 22 and 23, connected, respectively, to the plates 20 and 21 join the device to a load 24. A switch 25 is provided in the conductor 23 to permit convenient opening or closing of the circuit. When the switch is closed an electrical current flows between the elements 13 and 14 to the load 24.

In thermoelectric devices such as that shown in the drawing and described above the n-type member or element 13 may be the sintered reaction product of a mixture consisting essentially of from about 94% to over 99 mol percent $SnO_2$, from about 0.05 to 0.5 mol percent $Sb_2O_3$ and from 0 to about 5 mol percent of at least one oxide selected from the group consisting of ZnO and CdO. Such bodies as made in accordance with the procedure of the invention have a composition corresponding to the molal formula $100(SnO_2)\cdot x(Sb_2O_3)\cdot y(MO)$, wherein M represents at least one metal from the group consisting of zinc and cadmium, $x$ has a value varying from 0.05 to 0.5, and $y$ has a value varying from 0 to 5 and have indices of efficiency at 1000° K. in excess of 0.025.

In such thermoelectric devices the p-type element 14 may be of any desired composition. However, when, as is usually the case, relatively high power outputs are desired p-type elements formed of boron phosphide (such as those described in U.S. Patent No. 3,077,506, issued Feb. 12, 1963, to Hill et al.) or cobalt silicide (such as those described in U.S. Patent No. 3,072,733, issued Jan. 8, 1963, to Sasaki et al.) may be preferred since elements of these types may be operated at temperatures of 1000° K. and higher. Also useful as p-type elements at higher temperatures are those of $Li_2O$ doped nickel oxide described by Fenity in the article referred to above. It will be understood that in a number of instances the operating stability of thermoelectric elements at higher temperatures is improved by surrounding them with an inert gas or by placing them in vacuum.

It will be understood that the foregoing description of the present invention is exemplary and is not intended to be definitive of all aspects of the invention and the use of devices produced in accordance therewith. Accordingly it is expected that the appended claims will be interpreted as broadly as permitted by their terminology, and they are not to be limited to the specific examples set forth above.

I claim:

1. A thermoelectric device useful at temperatures above about 1000° K. comprising a p-type thermoelectric element and an n-type thermoelectric element, said elements being electrically joined to form a hot junction, said n-type thermoelectric element comprising a self-supporting sintered n-type semiconductor body having a composition corresponding to the molal formula $$100SnO_2 \cdot xSb_2O_3 \cdot yMO$$

wherein M represents at least one metal selected from the group consisting of zinc and cadmium, $x$ has a value in the range of from 0.05 to 0.5, and $y$ has a value in the range of from 0 to 5, said element having an index of efficiency (M) at 1000° K. of at least 0.025.

2. A thermoelectric device as defined in claim 1 in which said body contains a small amount, up to 5 moles, of ZnO.

3. A thermoelectric device as defined in claim 1 in which said body contains a small amount, up to 5 moles of CdO.

4. A thermoelectric device as defined in claim 1 in which about 0.1 mol percent of $Sb_2O_3$ is present.

5. A thermoelectric device as defined in claim 4 in which the ZnO content is from about 1 mol percent to 3 mol percent.

References Cited

UNITED STATES PATENTS

| | | | |
|---|---|---|---|
| 2,564,706 | 8/1951 | Mochel | 252—518 X |
| 2,985,700 | 5/1961 | Johnston | 136—239 X |
| 3,033,907 | 5/1962 | Rue | 136—238 X |
| 3,045,057 | 7/1962 | Cornish | 136—239 X |
| 3,073,881 | 1/1963 | Heibel et al. | 136—238 |

OTHER REFERENCES

Aitchison: Australian J. Appl. Sci. 5 (1):10–17, March 1951.

Kuznetsov: Soviet Phys. Sol. State 2 (1):30–36, July 1960.

ALLEN B. CURTIS, *Primary Examiner.*

WINSTON A. DOUGLAS, *Examiner.*

A. M. BEKELMAN, *Assistant Examiner.*